United States Patent
Sturcken et al.

(10) Patent No.: US 6,492,254 B2
(45) Date of Patent: Dec. 10, 2002

(54) BALL GRID ARRAY (BGA) TO COLUMN GRID ARRAY (CGA) CONVERSION PROCESS

(75) Inventors: Keith K. Sturcken, Nokesville, VA (US); George Clemen, Manassas Park, VA (US); Sheila J. Konecke, Leesburg, VA (US); Saint Nazario-Camacho, Culpepper, VA (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 52 days.

(21) Appl. No.: 09/774,010

(22) Filed: Jan. 31, 2001

(65) Prior Publication Data

US 2002/0102767 A1 Aug. 1, 2002

(51) Int. Cl.[7] ................................. H01L 21/44
(52) U.S. Cl. .................. 438/613; 438/613; 438/25; 438/54; 438/55; 438/106; 257/678
(58) Field of Search ............... 438/613, 25–26, 438/51, 54–55, 64, 106; 257/678

(56) References Cited

U.S. PATENT DOCUMENTS

| | | | | |
|---|---|---|---|---|
| 5,542,174 A | * | 8/1996 | Chiu | 29/840 |
| 5,641,990 A | * | 6/1997 | Chiu | 257/737 |
| 5,731,709 A | * | 3/1998 | Pastore et al. | 324/760 |
| 5,928,005 A | * | 7/1999 | Li et al. | 439/82 |
| 5,938,856 A | * | 8/1999 | Sachdev et al. | 134/1.3 |
| 6,116,427 A | * | 9/2000 | Wu et al. | |
| 6,158,644 A | * | 12/2000 | Brofman et al. | 228/56.3 |
| 6,235,996 B1 | * | 5/2001 | Farooq et al. | 174/257 |
| 6,259,155 B1 | * | 7/2001 | Interrante et al. | 257/690 |
| 6,283,359 B1 | * | 9/2001 | Brofman et al. | 228/180.22 |
| 6,312,791 B1 | * | 11/2001 | Fasano et al. | 428/210 |
| 6,339,534 B1 | * | 1/2002 | Coico et al. | 361/760 |

FOREIGN PATENT DOCUMENTS

| | | | | |
|---|---|---|---|---|
| GB | 2353745a | * | 8/1999 | H01L/21/00 |
| JP | 10-163406 | * | 6/1998 | H01L/23/50 |
| JP | 2002-9432 | * | 1/2002 | H05K/3/34 |

OTHER PUBLICATIONS

Six Sigma Services, "Ceramic Column Grid Array Attach," http://www.sixsigmaservices.com/ccgaattach.htm, Dec. 29, 1998.

Winslow Automation, Inc., "SolderQuik(TM)Column Grid Array (CGA)," http://www.winslowautomation.com/cga.htm, Sep. 29, 1998.

Six Sigma Services, "Solder Ball Attach," http://www.sixsigmaservices.com/ballattach.htm, Dec. 29, 1998.

Winslow Automation, Inc., "SolderQuik(TM) Gall Grid Array (BGA) Preforms," http://www.winslowautomation.com/bga.htm, Jan. 7, 1999.

Six Sigma Services, "BGA Repair," http://sixsigmaservices.com/bgarepair.htm, Dec. 29, 1998.

* cited by examiner

Primary Examiner—Matthew Smith
Assistant Examiner—Granvill D Lee, Jr.
(74) Attorney, Agent, or Firm—Swidler Berlin Shereff Friedman LLP

(57) ABSTRACT

A method of converting ball grid array (BGA) modules to column grid array (CGA) modules comprises steps of heating a BGA module, brushing the BGA module to remove the balls, and attaching columns to the module to create a CGA module. A method of converting a first CGA module to a second CGA module comprises steps of heating the first CGA module, brushing the first CGA module to remove the columns, and attaching columns to the module to create the second CGA module.

20 Claims, 3 Drawing Sheets

BALL GRID ARRAY (BGA) TO COLUMN GRID ARRAY (CGA) CONVERSION PROCESS

FIELD OF THE INVENTION

The current invention is concerned with the field of packaging and interconnection of electronic components. More specifically, it deals with a method of converting electronic components packaged using ball grid arrays (BGAs) to a column grid array (CGA) form.

BACKGROUND OF THE INVENTION

Many modern electronic components, for example, processor chips, have very large pincounts. These large pincounts are due to needs to interface with many other devices, processor word sizes (number of bits per each unit of information to be communicated to or from another device), and the like. When pincounts were smaller, more mature technologies, like wire bonding and tape bonding, were commonly used to perform the interconnection function. However, more recent devices with larger pincounts have caused manufacturers to resort to different technologies.

Among the more popular ways of dealing with the problems involved in providing connections for large-pincount devices is to use the ball grid array (BGA) technique. In a BGA, a small solder ball is bonded, during manufacture, to each contact point (pin) of the component. The balls provide a convenient way of then connecting the component to external leads.

FIGS. 1a and 1b show a representation of what such a BGA might look like. In FIG. 1a, a top view of a device packaged with BGA interconnects, device 1 is provided with an array of conductive balls 2 (made of solder and/or other conductive materials). Each of the balls is connected to a contact point of the device to provide an interconnection to another component (other device, power supply, ground, etc.). FIG. 1b shows a side view of the device shown in FIG. 1a.

Another way of providing interconnects for large-pincount devices is using column grid arrays (CGAs). In a CGA, a small column of solder is bonded, during manufacture, to each contact point (pin) of the component. The columns serve the same purpose as the balls in a BGA. FIG. 1c shows a side view of what the device of FIG. 1a packaged in a BGA configuration might look like if, instead, it were packaged in a CGA configuration. Note that each ball 2 is replaced with a column 2' to form the CGA package.

BGA electronic modules have become quite prevalent in the commercial electronics industry, and many useful devices are packaged in this manner. In some industry sectors, such as aerospace, military, and satellite communications, however, BGA packaging is not always the best packaging method. In particular, in such applications, BGA packaging does not offer the life and reliability required, due to the fact that, because of their relatively low height, the balls of a BGA are not pliant enough to absorb the differential expansion, during thermal expansions and contractions, between the device and a circuit board to which it is connected.

In such applications as aerospace, military, and satellite communications, CGAs, which, as discussed above, use columns instead of balls, are favored. Columns are taller than balls and are, therefore, more flexible and can absorb the difference in expansions and contractions between the device and the circuit board by bending, instead of cracking, as is often the case with balls.

A problem that commonly arises is that a component manufacturer will choose to package the component only one way, either in BGA or CGA form. Typically, a manufacturer producing a component in large quantities in BGA form will be unwilling to produce the same component, generally in limited quantities, in CGA form, for economic reasons. Hence, it would be desirable for the industry sectors in which CGA packaging is needed to be able to purchase components in BGA form and to convert them to CGA form.

SUMMARY OF THE INVENTION

One feature of the invention is to provide a process by which devices normally packaged in BGA form can be converted to CGA form.

Another feature of the invention is to provide CGA-packaged devices from BGA-packaged devices using the aforementioned process.

The inventive process, most simply stated, is to remove the balls from a BGA-packaged device and to replace them with columns to produce a CGA-packaged device. In one exemplary embodiment, the inventive process for removing the balls from a BGA-packaged device and replacing them with columns to produce a CGA-packaged device is achieved through the following steps:

heating a BGA module such that the material comprising the balls in the BGA melts;

brushing off the ball array surface to remove the balls; and joining columns to the I/O pads.

In another exemplary embodiment, solder flux is applied to the ball array surface prior to brushing off the surface to remove the balls.

In yet another exemplary embodiment of the invention, a step of dressing the I/O pads is performed after the balls have been removed. This may be done, for example, via the steps of applying further solder flux and brushing.

In further exemplary embodiments, the aforementioned inventive CGA-packaged device is one produced via the inventive method, and a similar inventive method is used to replace the columns of a first CGA module with new columns, to obtain a second CGA module.

These and other features of the invention will become apparent in the detailed description below.

BRIEF DESCRIPTION OF THE DRAWINGS

The invention will now be described in greater detail in connection with the attached drawings, in which:

FIGS. 1a, 1b, and 1c show representations of what BGA and CGA forms of a component might look like;

DETAILED DESCRIPTION OF THE INVENTION

The ensuing description deals with "solder" balls and columns, solder flux, and the like. However, this should not be taken to limit the invention strictly to solder. Other well-known materials used for making connections in BGAs and CGAs, like ceramics and plastics, may be used, as well; in such cases, analogous techniques for removing balls and attaching columns would be substituted accordingly. So, too, the invention also includes cases of starting with one material for the balls, say, solder, and attaching a different material for the columns, say, ceramic.

The techniques described below, in combination with the immediately preceding paragraph, may also be applied to convert a CGA with columns constructed of one material to a CGA with columns constructed of a different material, in a similar fashion.

Figure 1A:
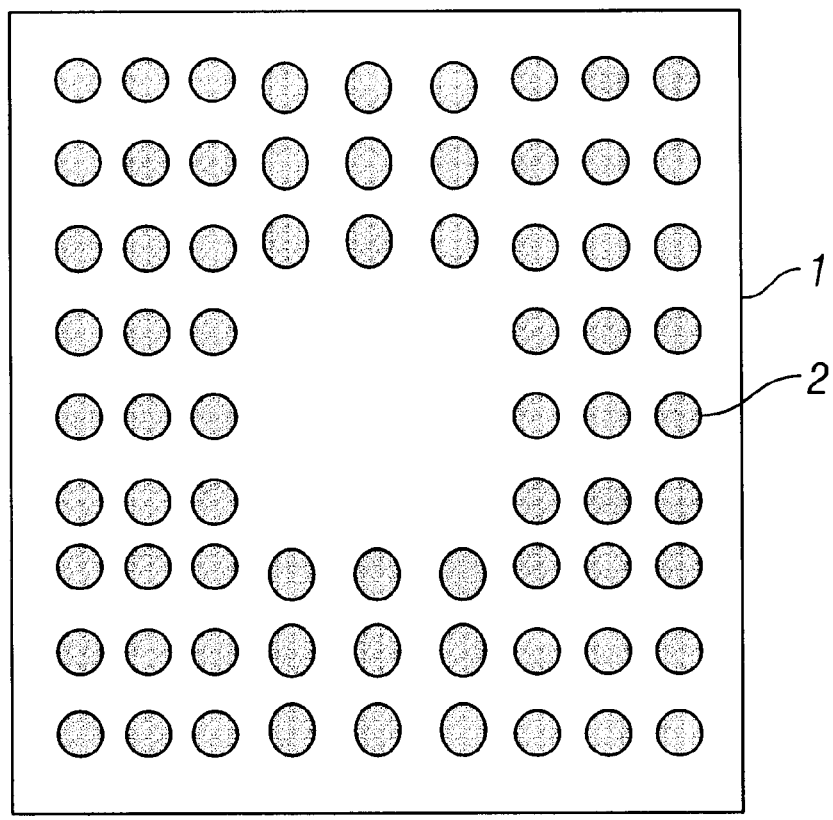
Figure 1B:
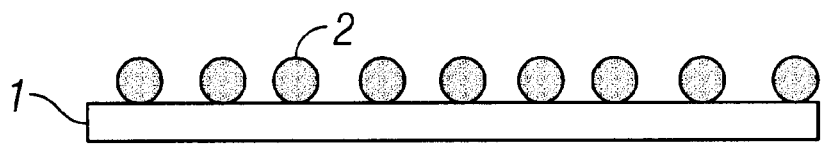
Figure 1C:
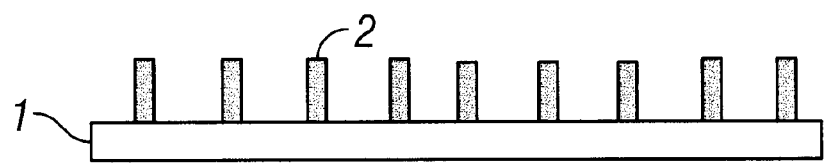
Figure 2:
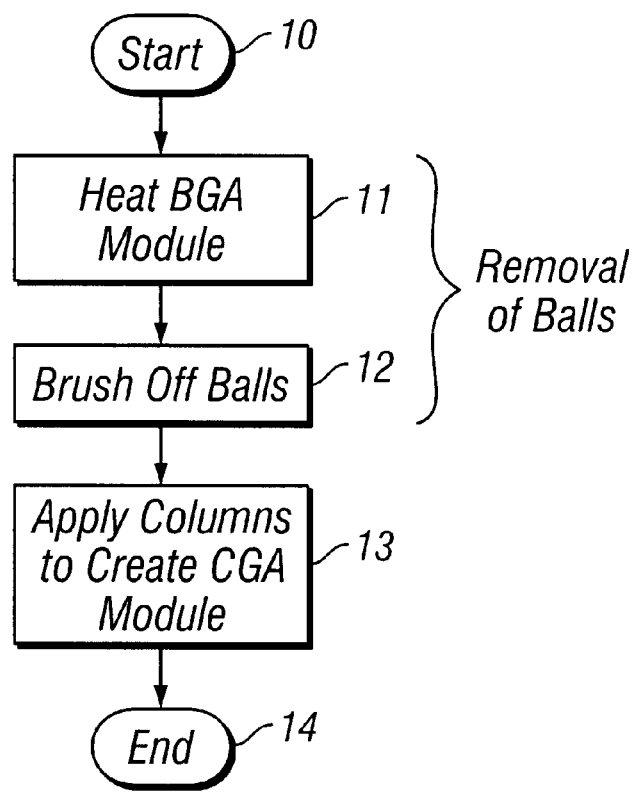
FIG. 2 shows a flowchart of a process according to an exemplary embodiment of the invention.

FIG. 2 describes the basic technique according to an exemplary embodiment of the invention. There are two basic parts to the process. The first is removal of the balls from the input BGA module, shown comprising steps of heating the BGA module 11 and brushing off the balls 12. The second part is to apply columns to the module to create a CGA module 13.

Figure 3:
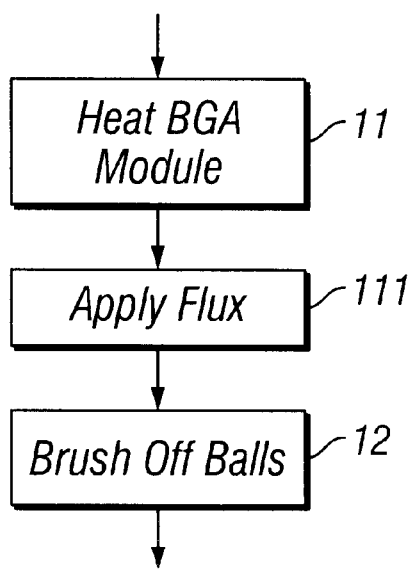
FIG. 3 shows a flowchart adding a further step to the flowchart of FIG. 2, according to an exemplary embodiment of the invention.

In the first part, the removal of the balls, the BGA module is first heated 11. In an embodiment of the invention, this is done by applying reflow heat. Then, preferably, as shown in FIG. 3, solder flux is applied to the surface where the balls are attached 111. Finally, the surface is brushed 12 to remove the balls. This brushing should be done carefully, so as not to damage the module.

Figure 4:
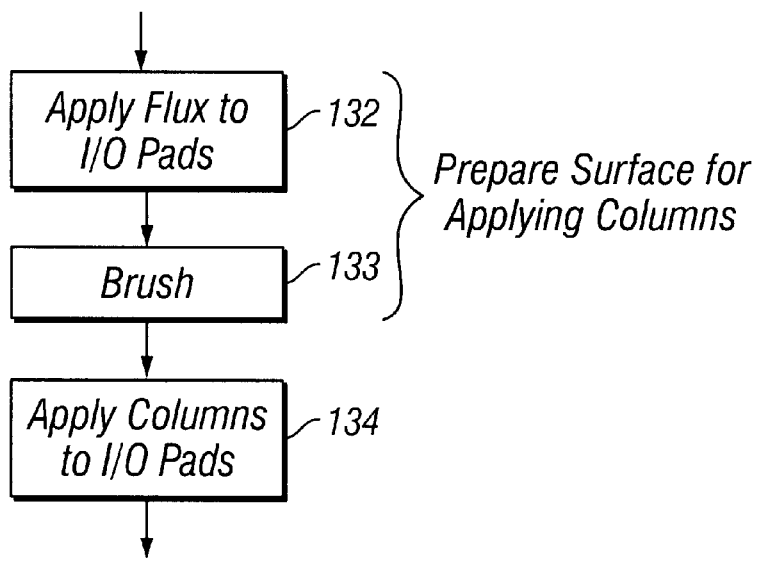
FIG. 4 shows further details of one of the steps of the flowchart of FIG. 2, according to an exemplary embodiment of the invention.

As shown in FIG. 2, the second part of the process is applying columns to the module 13. This second part can also be broken down into two sub-parts, according to an exemplary embodiment of the invention, as shown in FIG. 4. The first sub-part of the process of applying columns to create a CGA module 13 comprises preparing the surface of the module (i.e., the I/O pads) for applying columns, while the second sub-part comprises actually applying the columns to the I/O pads 134. In the first sub-part, flux is applied to the I/O pads 132, and the I/O pads are then brushed 133, thus, preparing them for attachment of columns. In one exemplary embodiment of the invention, the step of applying flux to the I/O pads 132 is accomplished by solder paste screening; this may be performed, for example, using a solder stencil screener.

Figure 5:
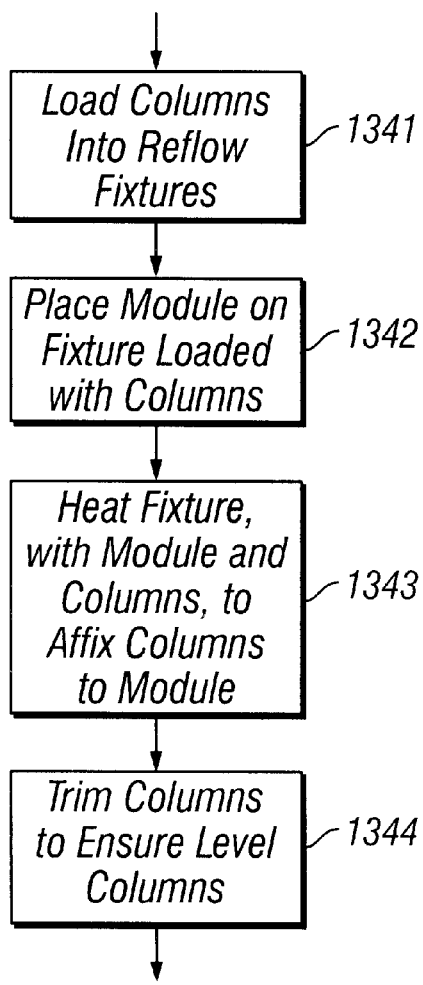
FIG. 5 shows further details of one of the steps of the flowchart of FIG. 4, according to an exemplary embodiment of the invention.

The step of applying the columns to the I/O pads 134, in one exemplary embodiment of the invention, comprises the steps shown in FIG. 5. First, columns are loaded into fixtures 1341. This may be done, for example, using a shaker/vacuum table. If reflow heating is to be used, the fixtures will be reflow fixtures.

The next step is to place the module on a fixture loaded with columns 1342, the fixture loaded with columns being the product of the previous step 1341. This placement should be done carefully so as to properly align the columns with the I/O pads. This may be done, for example, using guide pins and/or an alignment plate.

The next step is to then heat the fixture, which now has both the module and the columns, to affix the columns to the module 1343. This may be done, for example, using a belt reflow furnace. After heating, the module, with columns now affixed, is removed from the fixture; this may be done pneumatically, for example.

Finally, the columns are trimmed so as to be level 1344. This is done to provide for proper attachment of the module to, for example, a circuit board. This trimming may be done, for example, using a pneumatic "guillotine"-type tool.

As discussed above, the above techniques are also applicable to replacing columns of a CGA with other columns. This would be desirable, for example, if a different material were desired for the columns or if the existing columns were of an unacceptable size. The technique for removing balls, shown in FIGS. 2 and 3, is similarly applicable to removing columns: heat (and flux) and brush.

The invention has been described in detail with respect to exemplary embodiments, and it will now be apparent from the foregoing to those skilled in the art that changes and modifications may be made without departing from the invention in its broader aspects. The invention, therefore, as defined in the appended claims, is intended to cover all such changes and modifications as fall within the true spirit of the invention.

What is claimed is:

1. A method of converting a ball grid array (BGA) module, comprising balls coupled to I/O pads of the module, to a column grid array (CGA) module, comprising columns coupled to the I/O pads, the method comprising the steps of:
   heating the BGA module;
   brushing off the balls to obtain a bare module; and
   coupling columns to the bare module to create a CGA module.

2. The method according to claim 1, wherein the step of heating is followed by a step of applying flux to the BGA module.

3. The method according to claim 1, wherein the step of heating comprises a step of applying reflow heat.

4. The method according to claim 1, wherein the step of coupling columns to the module comprises the steps of:
   preparing for application of columns the surface of the bare module on which the I/O pads are located, to obtain a prepared module; and
   applying columns to the I/O pads of the prepared module.

5. The method according to claim 4, wherein the step of preparing comprises the steps of:
   applying flux to the I/O pads; and
   brushing the I/O pads.

6. The method according to claim 4, wherein the step of applying columns comprises steps of:
   loading columns into a fixture;
   placing the prepared module on the fixture loaded with columns; and
   heating the fixture, which has the module and the columns, to couple the columns to the I/O pads of the prepared module, thus resulting in a CGA module.

7. The method according to claim 6, further comprising a step of extracting the CGA module from the fixture.

8. The method according to claim 7, further comprising a step of trimming the columns to level the columns.

9. The method according to claim 7, wherein the step of extracting the CGA module comprises a step of pneumatically extracting the CGA module.

10. The method according to claim 6, wherein the step of loading columns comprises a step of using a shaker/vacuum table to load columns into a fixture.

11. The method according to claim 6, wherein the step of placing the prepared module comprises a step of aligning the prepared module such that its I/O pads are substantially aligned with the columns in the fixture.

12. The method according to claim 6, wherein the step of heating the fixture comprises a step of passing the fixture through a belt reflow furnace.

13. The method according to claim 1, wherein the columns to be coupled in the step of coupling columns are composed of a different material from the material that composes the balls of the BGA.

14. A CGA module produced by the method of claim 1.

15. A method of converting a first column grid array (CGA) module, comprising columns coupled to I/O pads of the module, to a second column grid array (CGA) module, the method comprising the steps of:

heating the first CGA module;

brushing off the columns to obtain a bare module; and coupling columns to the bare module to create the second CGA module.

16. The method according to claim 15, wherein the columns to be coupled in the step of coupling columns are composed of a different material from that of which the columns of the first CGA module are composed.

17. The method according to claim 15, wherein the step of heating the first CGA module is followed by a step of applying flux to the first CGA module.

18. The method according to claim 15, wherein the step of coupling columns to the module comprises the steps of:

preparing for application of columns the surface of the bare module on which the I/O pads are located, to obtain a prepared module; and applying columns to the I/O pads of the prepared module.

19. The method according to claim 18, wherein the step of preparing comprises the steps of:

applying flux to the I/O pads; and brushing the I/O pads.

20. The method according to claim 18, wherein the step of applying columns comprises steps of:

loading columns into a fixture;

placing the prepared module on the fixture loaded with columns; and heating the fixture, which has the module and the columns, to couple the columns to the I/O pads of the prepared module, thus creating the second CGA module.

* * * * *